(12) United States Patent
Nakazato et al.

(10) Patent No.: US 7,859,254 B2
(45) Date of Patent: Dec. 28, 2010

(54) CLOCK GENERATION CIRCUIT, ANALOG-DIGITAL ANGLE CONVERTER USING THE SAME, AND ANGLE DETECTION APPARATUS

(75) Inventors: Kenichi Nakazato, Tokyo (JP); Hisashi Nishimura, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 227 days.

(21) Appl. No.: 12/319,631

(22) Filed: Jan. 9, 2009

(65) Prior Publication Data

US 2009/0179634 A1 Jul. 16, 2009

(30) Foreign Application Priority Data

Jan. 11, 2008 (JP) ............... 2008-004830

(51) Int. Cl.
*G01B 7/30* (2006.01)

(52) U.S. Cl. ................. 324/207.25
(58) Field of Classification Search ........... 324/207.25
See application file for complete search history.

(56) References Cited

FOREIGN PATENT DOCUMENTS

| EP | 09000102.5 | 5/2009 |
| JP | 05-172505 | 7/1993 |
| JP | 2008-039583 | 2/2008 |

*Primary Examiner*—Reena Aurora
(74) *Attorney, Agent, or Firm*—David N. Lathrop

(57) ABSTRACT

Two-phase resolver signals output from a rotation angle detector are squared by first and second squaring circuits. The squared signals are added by an adding circuit. The DC component of the output signal from the adding circuit is removed by a filter. The output signal from the filter is compared with a reference potential by a comparator to generate a rectangular-wave signal. The phase of the rectangular-wave signal is corrected a phase shifter. The frequency of the output signal from the phase shifter is divided by 2 by a frequency dividing circuit in synchronization with an excitation signal supplied to the rotation angle detector to generate a synchronous clock.

8 Claims, 8 Drawing Sheets

CLOCK GENERATION CIRCUIT, ANALOG-DIGITAL ANGLE CONVERTER USING THE SAME, AND ANGLE DETECTION APPARATUS

BACKGROUND OF THE INVENTION

1. Field of the Invention

The present invention relates to a clock generation circuit for generating a synchronous clock from two-phase resolver signals, an analog-digital angle converter having the clock generation circuit, and an angle detection apparatus.

2. Description of the Related Art

FIG. 12 shows a clock generation circuit used in a conventional angle converter disclosed in Japanese Patent No. 3,100,211 (Japanese Patent Application Laid-Open No. H5-172505).

A resolver signal $K1=K \sin \theta \sin \omega t$ and a resolver signal $K2=K \cos \theta \sin \omega t$ obtained, for example, in a resolver 1A are input to an analog-digital converter (hereinafter called an A-D converter) 2. The resolver signals K1 and K2 are also input to a pair of squaring circuits 3a and 3b, respectively. The squaring circuits 3a and 3b square the resolver signals K1 and K2 to output squared signals $Y1=K^2 \sin^2 \theta \sin^2 \omega t$ and $Y2=K^2 \cos^2 \theta \sin^2 \omega t$. An adding circuit 4 adds the squared signals Y1 and Y2 to output a sum signal $4a=K^2 \sin^2 \omega t$ because $\sin^2 \theta + \cos^2 \theta = 1$. A square-root circuit 5 square-roots the sum signal 4a to output a signal $R=K \sin \omega t$. A level adjustment circuit 6 adjusts the amplitude of the signal R to output a signal $K' \sin \omega t$. This signal $K' \sin \omega t$ is input to a REF terminal 2c of the A-D converter 2. The A-D converter 2 uses the signal $K' \sin \omega t$ as a synchronous clock and outputs a digital angle signal 2d from the angle signals K1 and K2.

As described above, the conventional clock generation circuit requires the square-root circuit in order to obtain the synchronous clock. Since the square-root circuit uses an analog multiplier, it is relatively expensive.

SUMMARY OF THE INVENTION

In view of the foregoing situation, the present invention has been made. An object of the present invention is to provide a clock generation circuit for generating a synchronous clock without using a square-root circuit, an analog-digital angle converter provided with the clock generation circuit, and an angle detection apparatus.

A clock generation circuit according to the present invention generates a synchronous clock from two-phase resolver signals S1 and S2 corresponding to a rotation angle, the two-phase resolver signals being output from a rotation angle detector when an excitation signal is supplied. The clock generation circuit includes a first squaring circuit for squaring the resolver signal S1; a second squaring circuit for squaring the resolver signal S2; an adding circuit for adding output signals from the first and second squaring circuits; a rectangular-wave generator for generating a rectangular-wave signal from an output signal from the adding circuit; a phase shifter for correcting a phase of the rectangular-wave signal from the rectangular-wave generator; and a frequency dividing circuit for dividing by 2 an output signal from the phase shifter in frequency in synchronization with the excitation signal.

An analog-digital angle converter according to the present invention includes the above-described clock generation circuit and a calculation processing section adapted to output a digital angle of the rotation angle by using the resolver signals S1 and S2 and the synchronous clock generated by the clock generation circuit.

An angle detection apparatus according to the present invention includes a rotation angle detector that has windings for detection and windings for excitation and that is adapted to output two-phase resolver signals corresponding to a rotation angle through the windings for detection when an excitation signal is supplied to the windings for excitation, and the above-described analog-digital angle converter.

EFFECTS OF THE INVENTION

According to the present invention, a clock generation circuit can be provided without using a square-root circuit required by a conventional clock generation circuit.

DETAILED DESCRIPTION OF THE PREFERRED EMBODIMENTS

Figure 1:
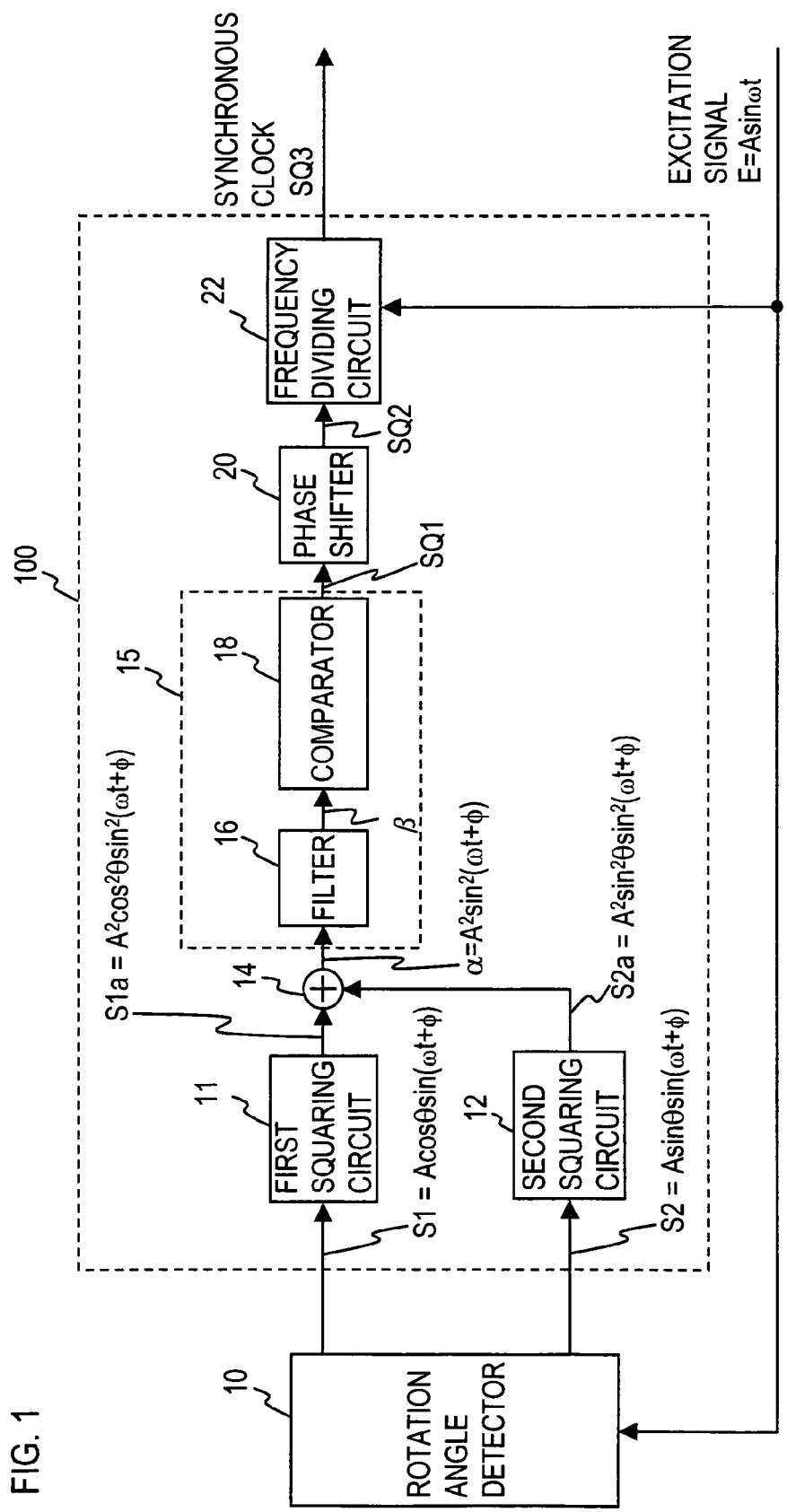
FIG. 1 is a block diagram showing the functional structure of a clock generation circuit according to an embodiment of the present invention.

Embodiments of the present invention will be described below by referring to the drawings. Identical symbols are assigned to identical components in multiple figures, and a description of the components is not repeated.

[Clock Generation Circuit]

FIG. 1 shows the functional structure of a clock generation circuit 100 according to an embodiment of the present invention. The clock generation circuit 100 includes first and second squaring circuits 11 and 12, an adding circuit 14, a rectangular-wave generator 15, a phase shifter 20, and a frequency dividing circuit 22.

Two-phase resolver signals output from a rotation angle detector 10 are input to the clock generation circuit 100. The rotation angle detector 10, for example, a resolver, outputs two-phase resolver signals based on a rotation angle. The resolver includes a rotor and a stator. One of the rotor and the stator is wound with single-phase windings for excitation and the other is wound with two-phase windings for detection. When a periodic excitation signal $E = A \sin \omega t$ is supplied to the windings for excitation, two-phase periodic resolver signals S1 and S2 based on the rotation angle θ of the rotor with respect to the stator are obtained. Specifically, the resolver signal $S1 = A \cos \theta \sin(\omega t + \phi)$ is output through a first-phase winding for detection and the resolver signal $S2 = A \sin \theta \sin(\omega t + \phi)$ is output through a second-phase winding for detection. The resolver signals are hereinafter called angle signals. In the foregoing expressions, A indicates a constant, t indicates time, ω indicates the angular velocity, and φ indicates the phase difference between the phase of the excitation signal E and the phase of the angle signals. The phase difference φ occurs because the rotation angle detector 10 uses electromagnetic coupling between the windings for detection and the windings for excitation. The phase of the angle signals is usually delayed from the phase of the excitation signal E by several degrees below 20 degrees. The angle signals S1 and S2 have amplitudes corresponding to the rotation angle θ, have the same phase, and are delayed in phase from the excitation signal E.

The angle signals S1 and S2 are input to the first squaring circuit 11 and the second squaring circuit 12, respectively. The first squaring circuit 11 squares the amplitude of the angle signal S1 to output a squared angle signal $S1a = A^2 \cos^2 \theta \sin^2(\omega t + \phi)$. The second squaring circuit 12 squares the amplitude of the angle signal S2 to output a squared angle signal $S2a = A^2 \sin^2 \theta \sin^2(\omega t + \phi)$. Since $\sin^2(\omega t + \phi) = (1 - \cos 2(\omega t + \phi))/2$, the frequency of the squared angle signals S1a and S2a is twice that of the angle signals S1 and S2.

The adding circuit 14 adds the squared angle signals S1a and S2a to output a sum signal $\alpha = A^2 \sin^2(\omega t + \phi)$ because $\sin^2 \theta + \cos^2 \theta = 1$ in the sum $A^2(\sin^2 \theta + \cos^2 \theta) \sin^2(\omega t + \phi)$.

The rectangular-wave generator 15 generates a rectangular-wave signal from the sum signal α. The rectangular-wave generator 15 includes a filter 16 and a comparator 18. The filter 16 removes a DC component from the sum signal α to output a signal β. The comparator 18 compares the signal β output from the filter 16 with a reference potential to output a rectangular-wave signal SQ1. The reference potential is a ground potential of an analog circuit comprising the filter 16 and the comparator 18 in the present embodiment.

Since the comparator 18 converts the signal β to the rectangular-wave signal SQ1 with the ground potential being used as a reference, a phase shift occurs. In other words, the rectangular-wave signal SQ1 is shifted in phase from the sum signal α. The phase shifter 20 corrects this phase shift to output a corrected rectangular-wave signal SQ2.

The frequency of the corrected rectangular-wave signal SQ2 is divided by 2 to obtain a synchronous clock SQ3. When the frequency is simply divided by 2, however, the synchronous clock SQ3 may be shifted in phase from the excitation signal E. Therefore, the frequency dividing circuit 22 divides by 2 the frequency of the corrected rectangular-wave signal SQ2 in synchronization with the excitation signal E to obtain the synchronous clock SQ3.

Figure 2A:
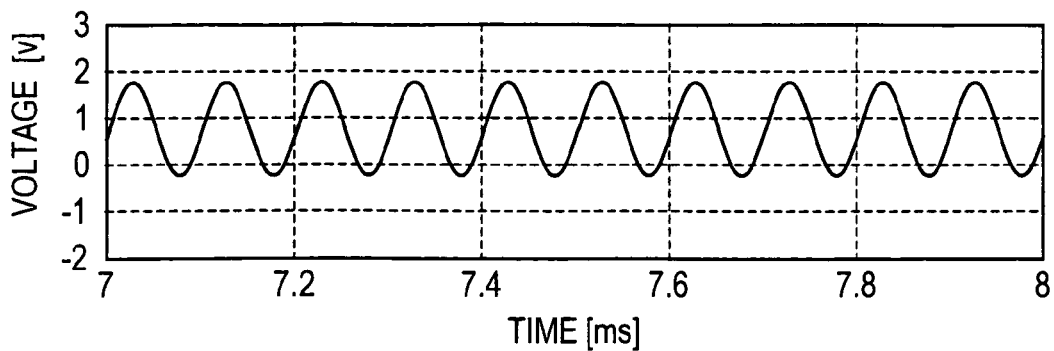
FIG. 2A is a graph showing resolver signals S1 and S2.
Figure 2B:
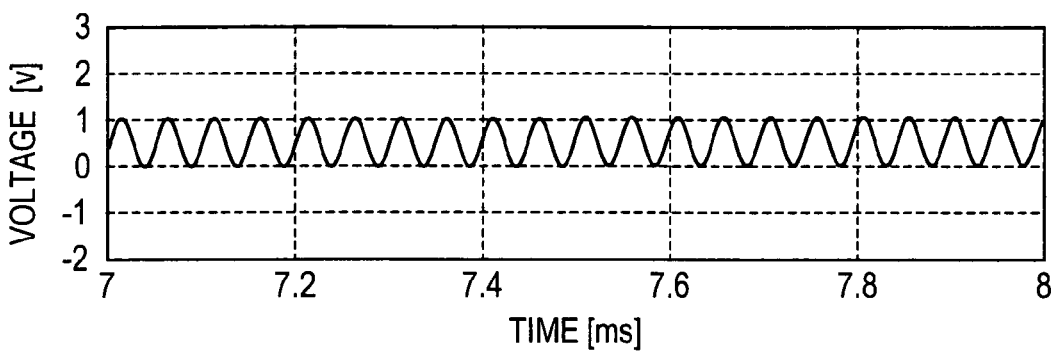
FIG. 2B is a graph showing the output signal waveforms from first and second squaring circuits.

Exemplifications of output waveforms from the components of the clock generation circuit 100, shown in FIG. 1, will be described below. The operation of the clock generation circuit 100 will be explained in detail with reference to FIG. 2A to FIG. 2D. When the constant A and the rotation angle θ of the angle signals S1 and S2 are √2 and 45°, the angle signals S1 and S2 are periodic signals having an amplitude of $2 V_{p-p}$ with 0 V being a center value, as shown in FIG. 2A. Since the first squaring circuit 11 and the second squaring circuit 12 square the angle signals S1 and S2 to generate the squared angle signals S1a and S2a, the squared angle signals S1a and S2a are periodic signals having an amplitude of 1 $V_{p-p}$ with 0.5 V being a center value, as shown in FIG. 2B. It is clear also from FIG. 2B that the squared angle signals S1a and S2a have twice the frequency of the angle signals S1 and S2.

Figure 2C:
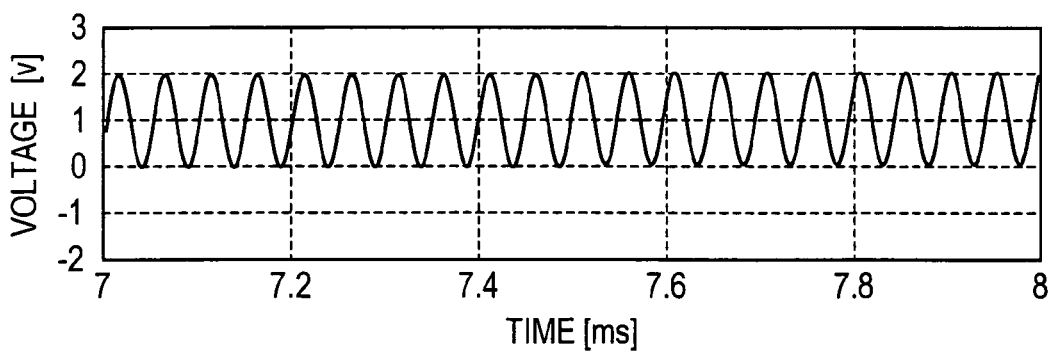
FIG. 2C is a graph showing the output signal waveform from an adding circuit.

The sum signal α, obtained by adding the squared angle signals S1a and S2a in the adding circuit 14, is a periodic signal having an amplitude of $2 V_{p-p}$ with 1 V being a center value, as shown in FIG. 2C. The average voltage of this sum signal α is 1 V.

Figure 2D:
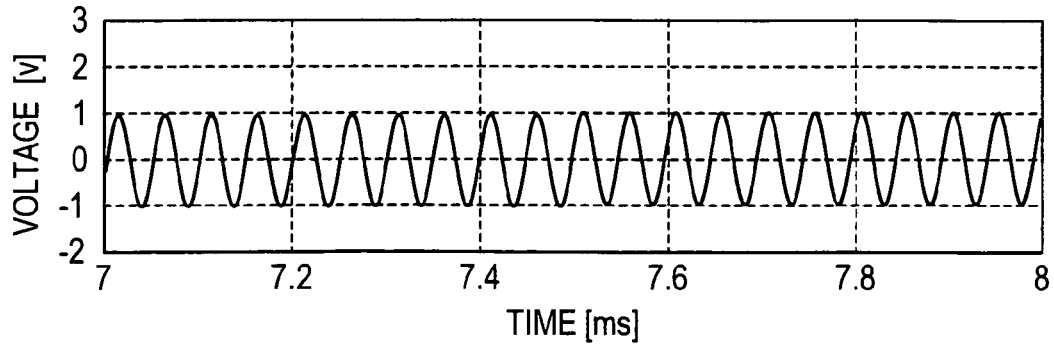
FIG. 2D is a graph showing the output signal waveform from a filter.

The rectangular-wave generator 15 comprising the filter 16 and the comparator 18 connected to the filter 16 and being connected to the adding circuit 14 converts the sum signal α to the rectangular-wave signal. The filter 16 is, for example, a high-pass filter (hereinafter called an HPF) for removing a DC component. FIG. 2D shows the signal β output from the filter 16. When the cut-off frequency of the HPF is preferably set to one tenth the frequency of the excitation signal E or less, the DC component of the sum signal α can be removed without distorting the sum signal α output from the adding circuit 14.

Figure 4A:
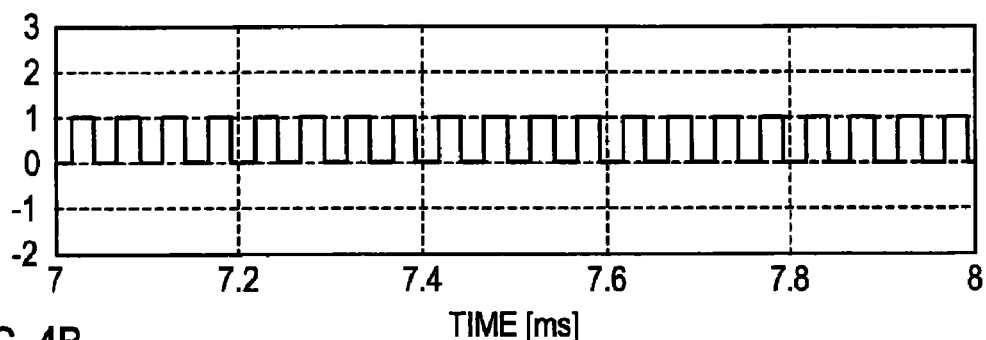
FIG. 4A is a graph showing the output signal waveform from the comparator.

The output signal β from the filter 16 is compared with the ground potential, which is a reference potential, by the comparator 18 and is converted to the rectangular-wave signal SQ1 shown in FIG. 4A.

Figure 3:
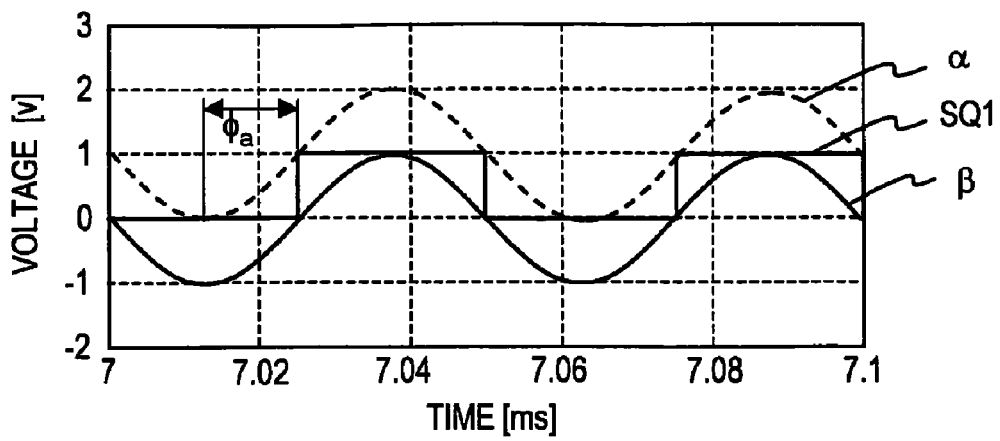
FIG. 3 is a graph used to describe a phase shift between the output signal from the adding circuit and the output signal from a comparator.

When the comparator 18 converts the signal β to the rectangular-wave signal SQ1 with the ground potential being used as a reference, a phase shift occurs. FIG. 3 shows the phase shift. In the figure, a line indicated by α shows the sum signal α, a line indicated by β shows the output signal β from the filter 16, and a line indicated by SQ1 shows the rectangular-wave signal SQ1. The rising timing of the rectangular-wave signal SQ1 is delayed from the time point where the sum signal α equals the reference potential of 0 V, and this delay Δt corresponds to a phase shift φa.

Since the average voltage of the sum signal α is 1 V, the delay Δt is the time difference between the time point $t_1$ where the sum signal α equals the reference potential of 0 V and the time point $t_2$ where the sum signal α equals 1 V. The following expressions (1) to (3) are satisfied when it is taken into account that the sum signal α is expressed by $2\sin^2(\omega t + \phi)$:

$$2\sin^2(\omega t_1 + \phi) = 0 \tag{1}$$

$$2\sin^2(\omega t_2 + \phi) = 1 \tag{2}$$

$$\Delta t = t_2 - t_1 \tag{3}$$

The following expression (4) is obtained from the expressions (1) to (3), where ω=2πf, and f indicates the frequency of the excitation signal E, for example, 10 kHz:

$$\Delta t = t_2 - t_1 \quad (4)$$
$$= (\arcsin(1/\sqrt{2}) - \phi)/\omega - (\arcsin(0) - \phi)/\omega$$
$$= (\arcsin(1/\sqrt{2}))/\omega$$

When the frequency f of the excitation signal E is 10 kHz, Δt equals 12.5 μs. Since the phase shift $\phi_a$ corresponds to the delay Δt, $$\phi_a = 12.5/50 \times 360 = 90°$$

because the frequency of the sum signal α is 2f (its period is 50 μs).

Figure 4B:
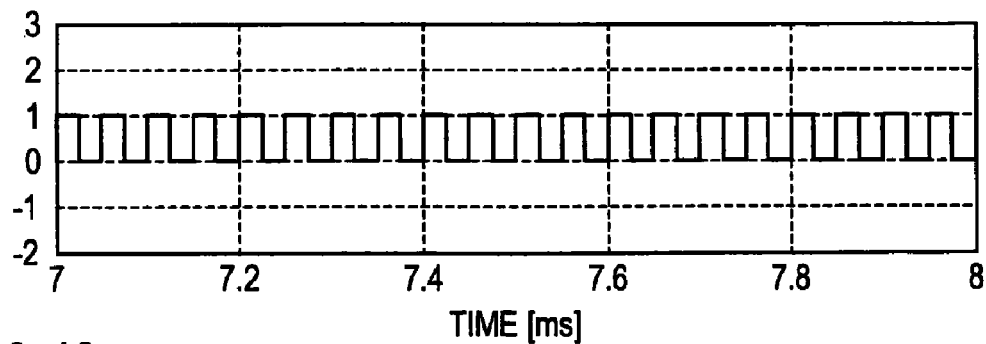
FIG. 4B is a graph showing the output signal waveform from a phase shifter.

Since the rectangular-wave signal SQ1 output from the comparator 18 has a phase shift of $\phi_a$ with respect to the sum signal α, the phase shifter corrects the phase shift $\phi_a$. FIG. 4B shows the waveform of a corrected signal output from the phase shifter 20. The signal shown in FIG. 4B is the corrected rectangular-wave signal SQ2 having twice the frequency of the synchronous clock SQ3.

Figure 5:
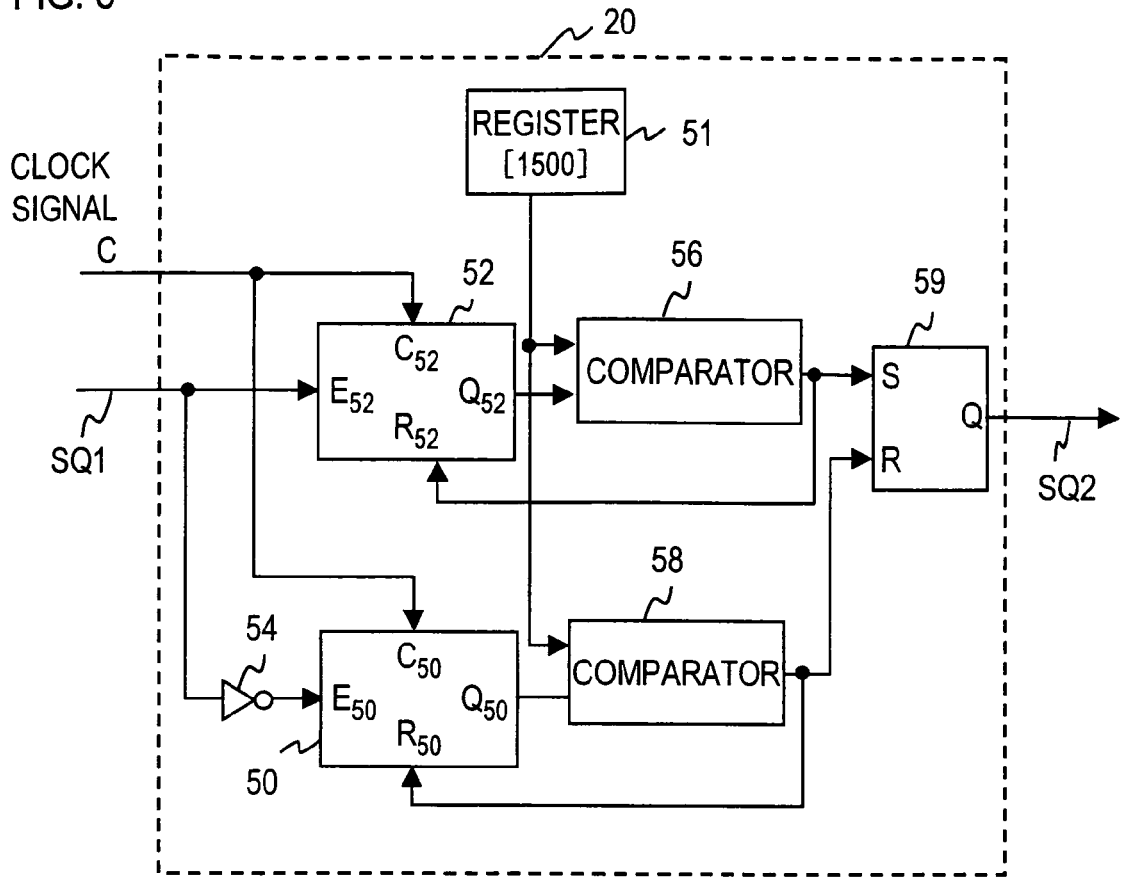
FIG. 5 is a block diagram showing an example structure of the phase shifter.

FIG. 5 shows an example structure of the phase shifter 20. The phase shifter 20 includes a register 51, a counter 50, an inverter 54, a comparator 56, a comparator 58, and an RS latch 59.

Correction of the phase shift $\phi_a$ is accomplished by outputting a signal having a waveform whose rising timing and falling timing in the voltage are delayed from those of the rectangular-wave signal SQ1. Since a phase delay of 90° cannot be advanced in the positive direction, the phase shifter 20 delays the signal by 270° (270°=360°−90°). This delay is set in the register 51 depending on the frequency of a clock signal C supplied from a clock supply circuit, not shown, and the frequency of the excitation signal E.

It is assumed, for example, that the frequency of the clock signal C is 40 MHz (its period equals 0.025 μs). When the frequency of the excitation signal E is 10 kHz, the period of the sum signal α is 50 μs. Therefore, the period of the sum signal α corresponds to 2,000(=50/0.025) cycles of the clock signal C. To delay the phase by 270°, a value of 1,500(=270/360×2,000) is set in the register 51.

The rectangular-wave signal SQ1 output from the comparator 18 is input to an enable terminal $E_{52}$ of the counter 52. The rectangular-wave signal SQ1 is also inverted by the inverter 54 and input to an enable terminal $E_{50}$ of the counter 50. The clock signal C is input to a clock signal terminal $C_{52}$ of the counter 52 and to a clock signal terminal $C_{50}$ of the counter 50.

A signal output from an output terminal $Q_{52}$ of the counter 52 is input to the comparator 56, and a signal output from an output terminal $Q_{50}$ of the counter 50 is input to the comparator 58. The output from the register 51 is input to the comparators 56 and 58. The output from the comparator 56 is input to a clear terminal $R_{52}$ of the counter 52, and the output from the comparator 58 is input to a clear terminal $R_{50}$ of the counter 50. The output from the comparator 56 is also input to a set terminal S of the RS latch 59, and the output from the comparator 58 is also input to a reset terminal R of the latch 59. A signal output from an output terminal Q of the RS latch 59 is the corrected rectangular-wave signal SQ2.

The counters 50 and 52 are, for example, 11-bit binary counters. When a value of 1 is input to the enable terminals $E_{50}$ and $E_{52}$, the counters 50 and 52 start counting the number of pulses of the clock signal C. The counter 52 outputs the count of the clock signal C from the output terminal $Q_{52}$, and the counter 50 outputs the count of the clock signal C from the output terminal $Q_{50}$.

When the rectangular-wave signal SQ1 changes from 0 to 1, for example, the counter 52 starts counting but the counter 50 does not start counting because the rectangular-wave signal SQ1 inverted by the inverter 54 is input to the counter 50. The counter 52 outputs the count from the output terminal $Q_{52}$, and the counter 50 outputs 0 from the output terminal $Q_{50}$.

The comparator 56 compares the count output from the output terminal $Q_{52}$ of the counter 52 with the output value (1,500) from the register 51. When the count of the counter 52 is smaller than 1,500, the comparator 56 outputs 0. When the count of the counter 52 reaches 1,500, the comparator 56 outputs 1. The comparator 58 compares the count output from the output terminal $Q_{50}$ of the counter 50 with the output value (1,500) from the register 51. Since the count of the counter 50 is zero and is not equal to or not over 1,500, the comparator 58 outputs 0. The output, 0, from the comparator 58 is input to the reset terminal R of the RS latch 59 and a change from 0 to 1 of the output from the comparator 56 is input to the set terminal S of the latch 59. Then, the RS latch 59 outputs 1 from an output terminal Q.

When the output, 1, from the comparator 56 is input to the clear terminal $R_{52}$ of the counter 52, the counter 52 stops counting at a falling timing of the clock signal C and outputs 0 from the output terminal $Q_{52}$.

Then, when the rectangular-wave signal SQ1 changes from 1 to 0, the counter 50 starts counting because the rectangular-wave signal SQ1 inverted by the inverter 54 is input to the counter 50. The counter 50 outputs the count from the output terminal $Q_{50}$. The counter 52 remains to stop counting and outputs 0 from the output terminal $Q_{52}$.

When the count of the counter 50 reaches 1,500, the comparator 58 changes its output from 0 to 1. Since the count of the counter 52 is zero, the comparator 56 outputs 0. The output, 0, from the comparator 56 is input to the set terminal S of the RS latch 59 and a change from 0 to 1 of the output from the comparator 58 is input to the reset terminal R of the latch 59. Then, the RS latch 59 outputs 0 from the output terminal Q.

When the output, 1, from the comparator 58 is input to the clear terminal $R_{50}$ of the counter 50, the counter 50 stops counting at a falling timing of the clock signal C and outputs 0 from the output terminal $Q_{50}$.

When the rectangular-wave signal SQ1 from the comparator 18 alternately repeats a change from 0 to 1 and a change from 1 to 0, the phase shifter 20 alternately repeats the foregoing operations. The corrected rectangular-wave signal SQ2, obtained by compensating the rectangular-wave signal SQ1 for the phase shift $\phi_a$, is output.

Figure 4C:
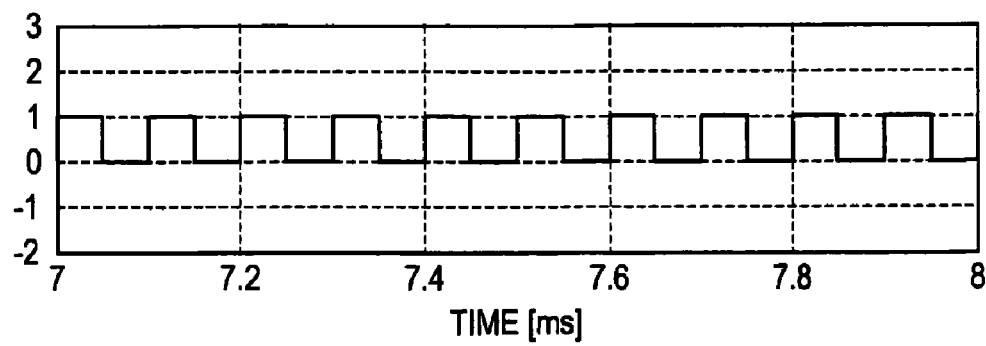
FIG. 4C is a graph showing the output signal waveform from a frequency dividing circuit.

When the frequency of the corrected rectangular-wave signal SQ2 is divided by 2, the synchronous clock SQ3 having half the frequency of the corrected rectangular-wave signal SQ2 is obtained (see FIG. 4C). If the frequency of the corrected rectangular-wave signal SQ2 is simply divided by 2 without taking into account the phase relationship with the excitation signal E, however, the phase of the synchronous clock SQ3 may be inverted depending on the initial state of the frequency dividing circuit or the timing of the start of frequency division. Therefore, the frequency dividing circuit 22 divides by 2 the frequency of the corrected rectangular-wave signal SQ2 in synchronization with the excitation signal E.

Figure 6:
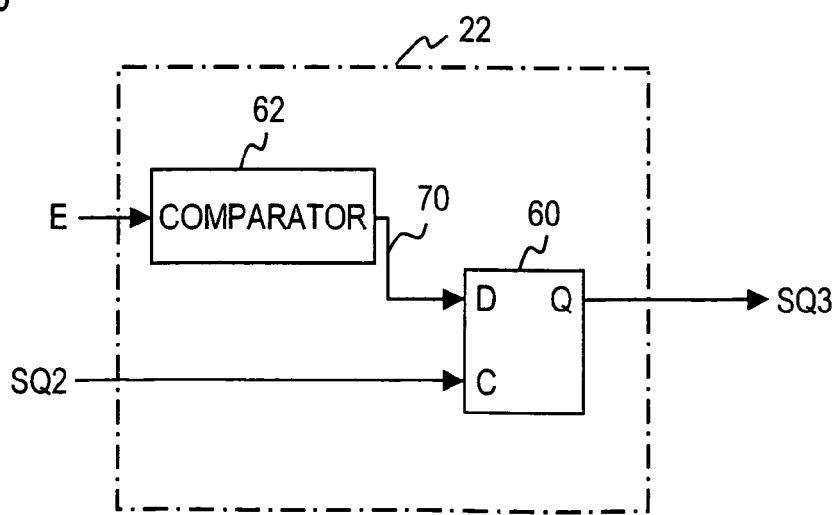
FIG. 6 is a block diagram showing an example structure of the frequency dividing circuit.

FIG. 6 shows an example structure of the frequency dividing circuit 22. The frequency dividing circuit 22 includes a comparator 62 and a D-type flip-flop (DFF) 60. The excitation signal E is input to the comparator 62. The output signal from the phase shifter 20, which is the corrected rectangular-wave signal SQ2, is input to a C terminal of the DFF 60. The DFF 60 outputs the synchronous clock SQ3 from its Q terminal.

Figure 7A:
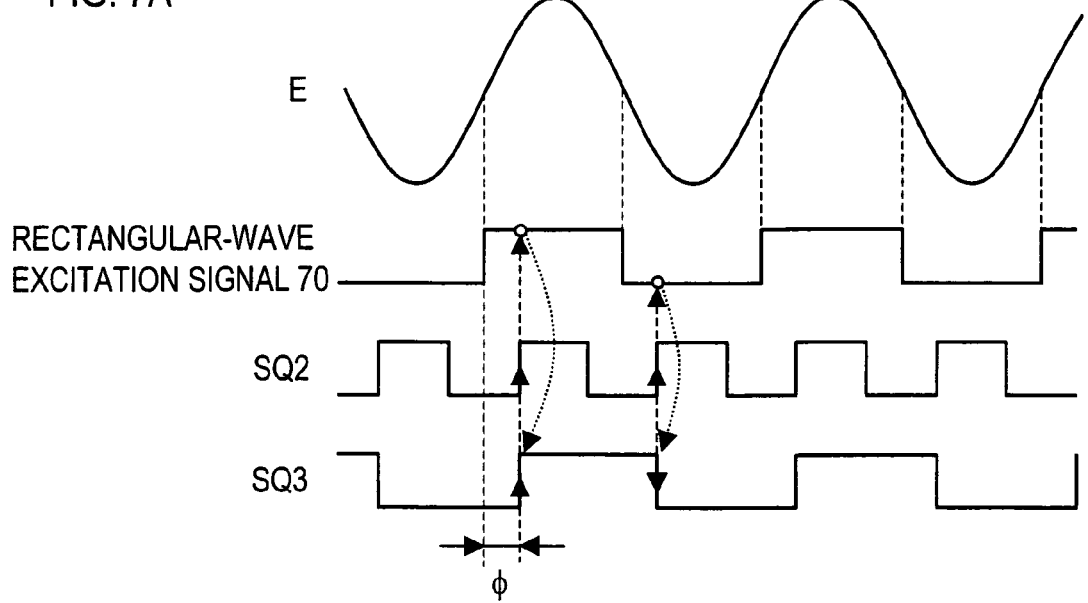
FIG. 7A is a timing chart showing the operation of the frequency dividing circuit when angle signals S1 and S2 are delayed in phase from an excitation signal.

The operation of the frequency dividing circuit 22 will be described below with reference to FIG. 7A. The comparator 62 compares the excitation signal E with the reference potential to output a rectangular-wave excitation signal 70. The reference potential used by the comparator 62 is the ground potential. The DFF 60 latches the rectangular-wave excitation signal 70 at the rising timing of the corrected rectangular-wave signal SQ2 to achieve synchronization and frequency division with a factor of 2 at the same time. In other words, the synchronous clock SQ3, which is a rectangular-wave signal having half the frequency of the corrected rectangular-wave signal SQ2, is output from the Q terminal of the DFF 60.

[Analog-Digital Angle Converter]

Figure 8:
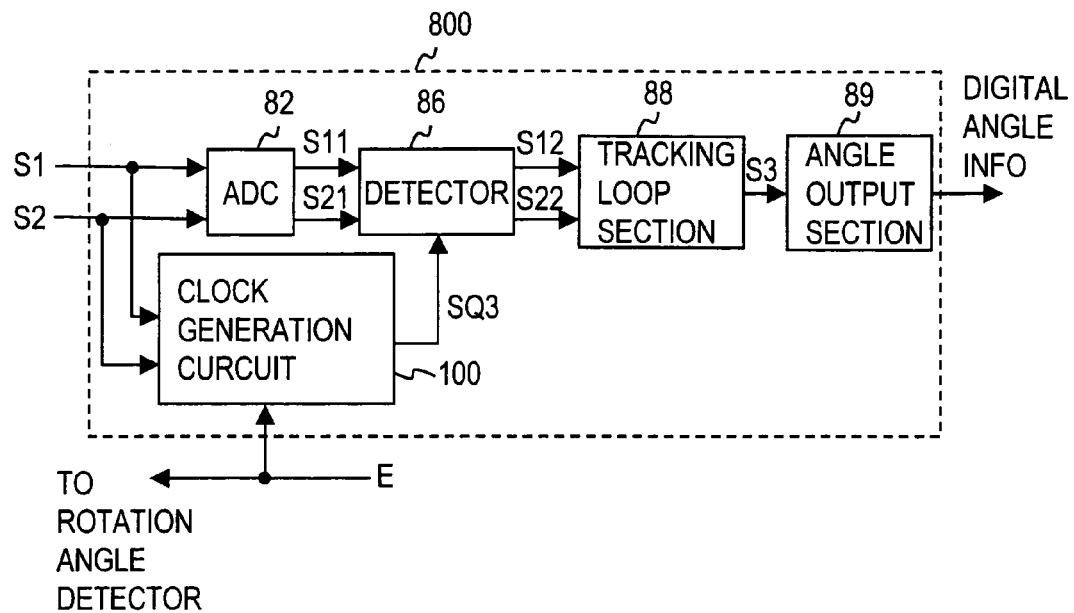
FIG. 8 is a block diagram showing the functional structure of an analog-digital angle converter according to an embodiment of the present invention.

FIG. 8 shows a functional structure of an analog-digital angle converter 800 according to an embodiment of the present invention. The analog-digital angle converter 800 includes a clock generation circuit according to the present invention, for example, the clock generation circuit 100 shown in FIG. 1. The analog-digital angle converter 800 uses the angle signals S1 and S2 sent from the rotation angle detector 10 and the synchronous clock SQ3 sent from the clock generation circuit 100 to output digital angle information. In addition to the clock generation circuit 100, the analog-digital angle converter 800 includes an analog-digital converter (hereinafter called an ADC) 82, a detector 86, a tracking loop section 88, and an angle output section 89.

The angle signals S1 and S2 sent from the rotation angle detector 10 are converted to digital signals S11 and S21 by the ADC 82.

The detector 86 synchronously detects the digitized angle signals S11 and S12 with reference to the synchronous clock SQ3 to generate signals S12 and S22 from which the excitation signal $\sin(\omega t + \phi)$ is removed. Assuming that the angle signal S1 is expressed by $A \cos \theta \sin(\omega t + \phi)$, the signal S12 is a digital value of $A \cos \theta$, and the signal S22 is a digital value of $A \sin \theta$.

The tracking loop section 88 applies calculation to the signals S12 and S22 to generate a digital angle ψ. The tracking loop section 88 includes a first multiplier, a second multiplier, a subtractor, a first integrator, a compensator, a second integrator, a sine ROM, and a cosine ROM.

The sine ROM receives the digital angle ψ and outputs sin ψ. The cosine ROM receives the digital angle ψ and output cos ψ. The digital angle ψ is generated by the tracking loop section 88.

The first multiplier multiplies the signal S12 input to the tracking loop section 88 by sin ψ output from the sine ROM to generate $A \cos \theta \sin \psi$. The second multiplier multiplies the signal S22 input to the tracking loop section 88 by cos ψ output from the cosine ROM to generate $A \sin \theta \cos \psi$.

The subtractor subtracts the output $A \sin \theta \cos \psi$ from the second multiplier from the output $A \cos \theta \sin \psi$ from the first multiplier to generate $A \sin(\theta - \psi)$. The output from the subtractor is integrated by the first integrator and input to the compensator. The compensator is used to stabilize the characteristics of a feedback control system in the tracking loop, and its function is, for example, expressed by $(1-aZ^{-1})/(1-bZ^{-1})$, where a and b are constants and $Z^{-1}$ indicates the Z transformation of a delay operator. The second integrator integrates the output from the compensator to generate the digital angle ψ.

The tracking loop section 88 controls the integration result ψ such that the difference between the rotation angle θ of the angle signals S1 and S2 and the digital angle ψ is zero. Therefore, the digital angle ψ generated by the tracking loop section equals the rotation angle θ.

A method for calculating the digital angle ψ by making the difference between the rotation angle θ and the digital angle ψ zero is generally called a tracking loop method. The angle output section 89 serves as an interface for outputting the digital angle ψ from the analog-digital angle converter to an external unit.

[Angle Detection Apparatus]

Figure 11:
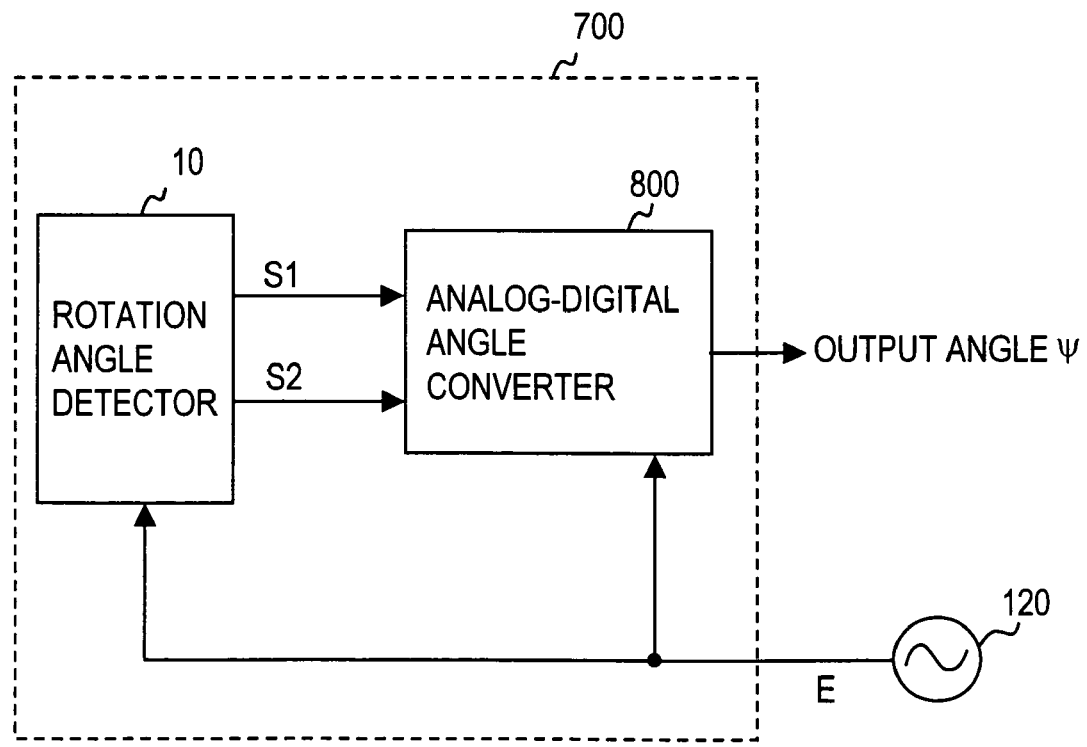
FIG. 11 is a block diagram of an angle detection apparatus according to an embodiment of the present invention.
Figure 12:
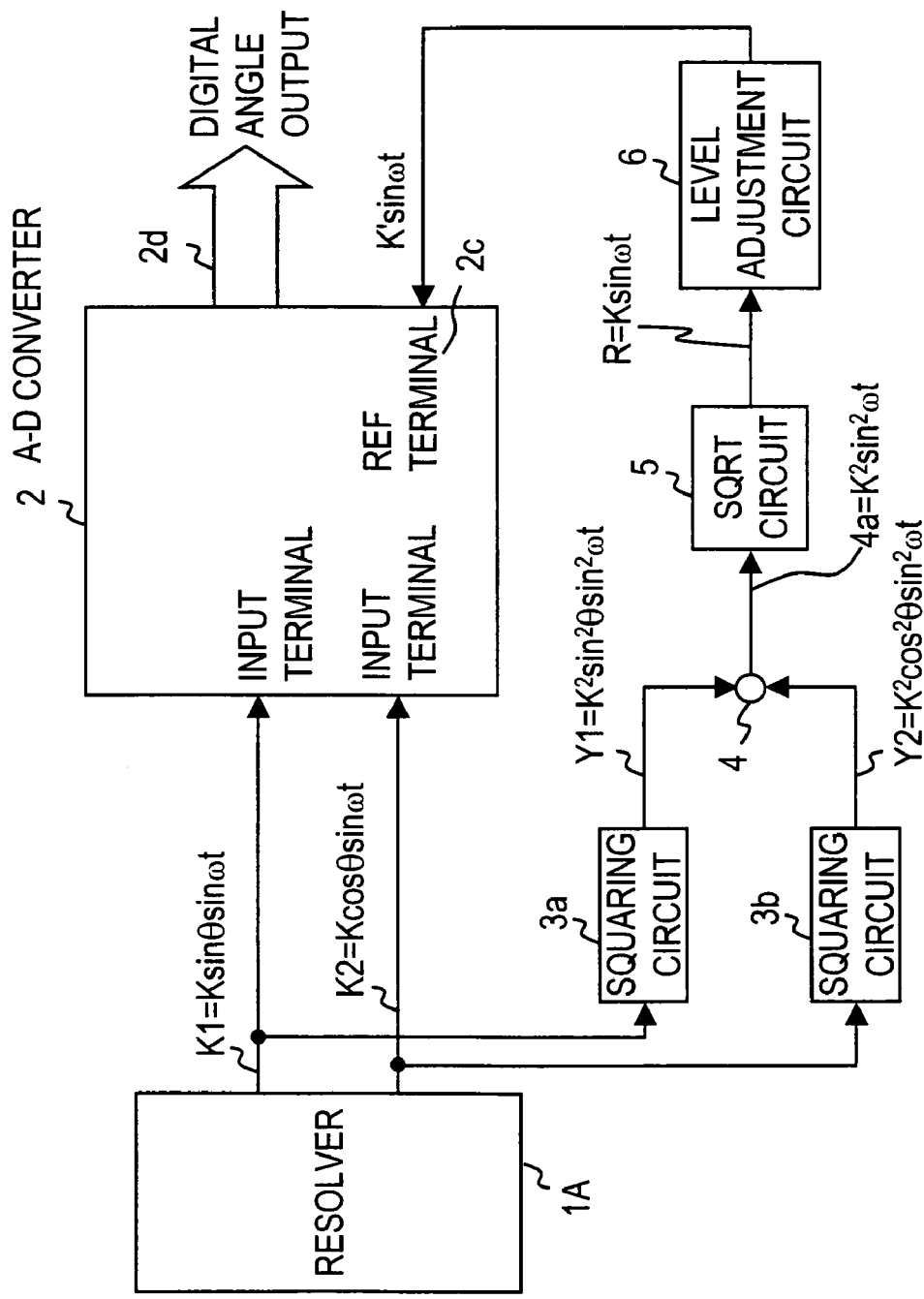
FIG. 12 is a block diagram of a conventional clock generation circuit.

FIG. 11 shows the functional structure of an angle detection apparatus 700 according to an embodiment of the present invention. The angle detection apparatus 700 includes an analog-digital angle converter according to the present invention, for example, the analog-digital angle converter 800 shown in FIG. 8. The angle detection apparatus 700 further includes the rotation angle detector 10.

An excitation signal source 120 supplies a sinusoidal excitation signal E to the rotation angle detector 10 and to the analog-digital angle converter 800. The rotation angle detector 10 is, for example, a two-phase resolver and outputs the angle signals S1 and S2 while receiving the excitation signal E, as described before. The angle signals S1 and S2 are input to the analog-digital angle converter 800, and the output angle ψ is obtained. The structure and functions of the analog-digital angle converter 800 are as described before.

[Modification 1]

The frequency dividing circuit 22 shown in FIG. 6 is for a case where the phases of the angle signals S1 and S2 are delayed from the phase of the excitation signal E. Depending on the wiring condition and impedance condition between the rotation angle detector 10 and the analog-digital angle converter 800, however, the angle signals S1 and S2 may have a phase lead with respect to the excitation signal E.

Figure 7B:
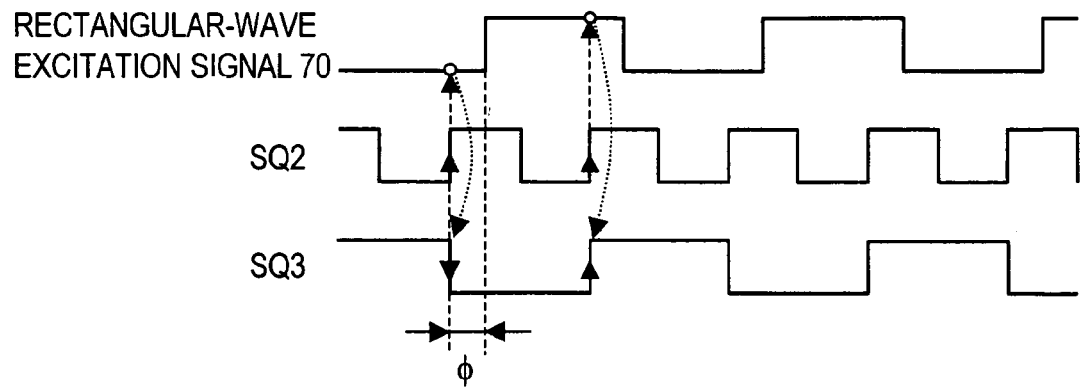
FIG. 7B is a timing chart showing the operation of the frequency dividing circuit when the angle signals S1 and S2 have a phase lead with respect to the excitation signal.

In that case, the corrected rectangular-wave signal SQ2 sent from the phase shifter 20 has a phase lead with respect to the excitation signal E. Therefore, if the synchronous clock SQ3 is generated from the corrected rectangular-wave signal SQ2 sent from the phase shifter 20 and the excitation signal E, the phase of the synchronous clock SQ3 is inverted, as shown in FIG. 7B, which is erroneous.

Figure 9:
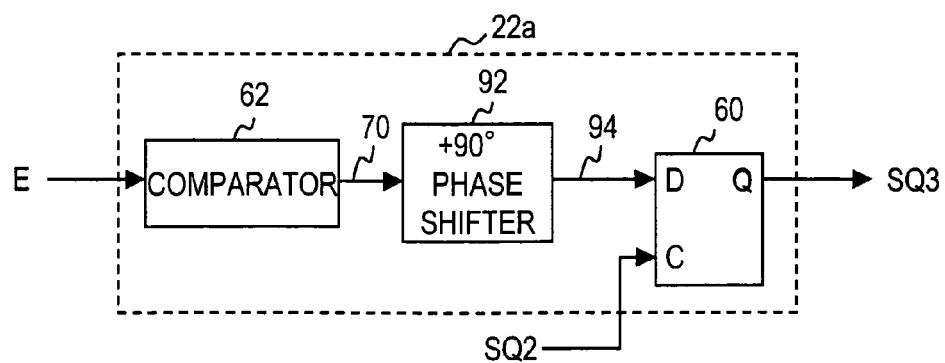
FIG. 9 is a block diagram showing an example structure in which the frequency dividing circuit is formed of a comparator, a $+90°$ phase shifter, and a DFF.

To handle such a situation, a frequency dividing circuit 22a shown in FIG. 9 is used. To prevent the phase from being inverted, the phase of the rectangular-wave excitation signal 70, which the DFF 60 references, needs to lead by 90 degrees. To make the phase lead by 90 degrees, the frequency dividing circuit 22a is provided with a +90° phase shifter 92 between the comparator 62 and the DFF 60. The +90° phase shifter 92 can be configured in the same way as the phase shifter 20 described before. Specifically, the output signal from the comparator 62 needs to be delayed by a time corresponding to a phase of 270 degrees. The +90° phase shifter 92 outputs a rectangular-wave excitation signal 94 which has a phase lead of 90 degrees with respect to the rectangular-wave excitation signal 70.

Figure 7C:
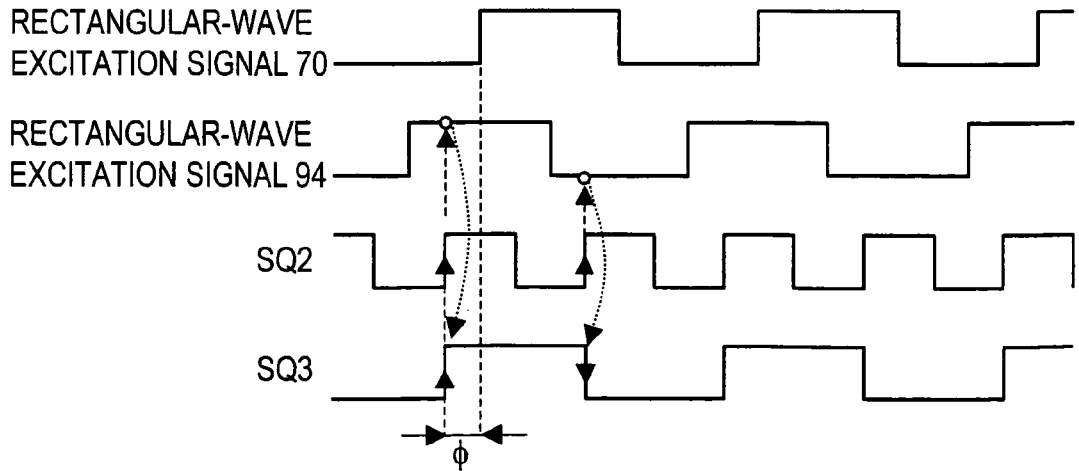
FIG. 7C is a timing chart showing the operation of the frequency dividing circuit when a rectangular-wave excitation signal is given a phase lead of 90 degrees.

Even if the phase of the corrected rectangular-wave signal SQ2 sent from the phase shifter 20 leads for the reason described above, since the rectangular-wave excitation signal 94 is input to the DFF 60, the DFF 60 correctly outputs the synchronous clock SQ3, as shown in FIG. 7C. The frequency dividing circuit 22a shown in FIG. 9 can output the synchronous clock SQ3 having the correct phase between when the angle signals S1 and S2 have a phase lead of 45 degrees with respect to the excitation signal E and when the angle signals S1 and S2 are delayed from the excitation signal E by 45 degrees in phase.

[Modification 2]

Figure 10:
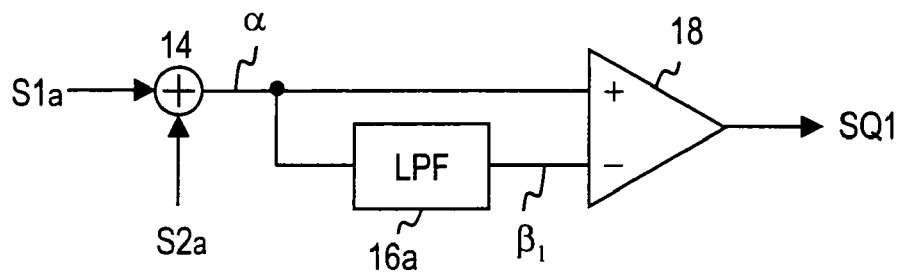
FIG. 10 is a block diagram showing a part of a clock generation circuit where a low-pass filter is used.

In the foregoing description, the filter 16 serves as an HPF. The filter 16 is, however, not limited to an HPF. For example, the filter 16 is a low-pass filter (hereinafter called an LPF), instead of an HPF. FIG. 10 shows a part of a clock generation circuit that uses a filter 16*a* serving as an LPF. The components used other than the filter 16*a* are the same as those used in the clock generation circuit 100 shown in FIG. 1. The sum signal α is input to the filter 16*a*. The output signal $\beta_1$ from the filter 16*a* is input to the inverted input terminal (−) of the comparator 18. The sum signal α is also input to the non-inverted input terminal (+) of the comparator 18. The output from the comparator 18 is input to the phase shifter 20.

When the cut-off frequency of the filter 16*a* is set sufficiently lower than the frequency of the angle signals S1 and S2, the output signal $\beta_1$ from the filter 16*a* is equal to the average voltage (the DC component) of the sum signal α. The comparator 18 generates a rectangular-wave signal from the sum signal α, with the average voltage output from the filter 16*a* used as a reference, and outputs the rectangular-wave signal. This rectangular-wave signal is the same as the rectangular-wave signal SQ1 of the comparator 18 described in the above embodiments.

The reference potential of the comparator 18 is not necessarily the average voltage of the sum signal α. The reference potential given to the comparator 18 needs to be in the range of the amplitude of the sum signal α. The phase shift determined by a specified reference potential needs to be shifted by the phase shifter 20. Further, the filter 16 may be a bandpass filter (hereinafter called a BPF). For example, it is possible that a sinusoidal signal having twice the frequency of the excitation signal E is extracted from the sum signal α by the BPF, the sinusoidal signal is converted to a rectangular-wave signal by the comparator 18, the rectangular-wave signal is divided by 2 in frequency by the frequency dividing circuit 22 to generate the synchronous clock SQ3.

It is clear from the above-described embodiments and modifications that clock generation circuits according to the present invention do not use an expensive square-root circuit and are formed of inexpensive components such as the first and second squaring circuits, the adding circuit, the filter, the comparators, the phase shifter, and the frequency dividing circuit. In other words, according to the present invention, clock generation circuits can be manufactured at lower cost than clock generation circuits that use a square-root circuit, which leads to lower manufacturing cost of analog-digital angle converters and angle detection apparatuses that use such clock generation circuits.

Clock generation circuits, analog-digital angle converters, and angle detection apparatuses of the present invention are not limited to the above-described embodiments, and can be modified, if necessary, without departing from the gist of the present invention.

What is claimed is:

1. A clock generation circuit for generating a synchronous clock from two-phase resolver signals S1 and S2 corresponding to a rotation angle, the two-phase resolver signals being output from a rotation angle detector when an excitation signal is supplied, the clock generation circuit comprising:
a first squaring circuit for squaring the resolver signal S1;
a second squaring circuit for squaring the resolver signal S2;
an adding circuit for adding output signals from the first and second squaring circuits;
a rectangular-wave generator for generating a rectangular-wave signal from an output signal from the adding circuit;
a phase shifter for correcting a phase of the rectangular-wave signal from the rectangular-wave generator; and
a frequency dividing circuit for dividing by 2 an output signal from the phase shifter in frequency in synchronization with the excitation signal.

2. The clock generation circuit according to claim 1, wherein the rectangular-wave generator comprises:
a filter for removing a DC component of the output signal from the adding circuit; and
a comparator for comparing an output signal from the filter with a ground potential to output the rectangular-wave signal.

3. The clock generation circuit according to claim 1, wherein the rectangular-wave generator comprises:
a filter for obtaining a DC component of the output signal from the adding circuit; and
a comparator for comparing an output signal from the filter with the output signal from the adding circuit to output the rectangular-wave signal.

4. The clock generation circuit according to any of claims 1 to 3, wherein the frequency dividing circuit divides by 2 the output signal from the phase shifter in frequency in synchronization with a signal having the same phase as the excitation signal.

5. The clock generation circuit according to any of claims 1 to 3, wherein the frequency dividing circuit divides by 2 the output signal from the phase shifter in frequency in synchronization with a signal whose phase leads that of the excitation signal by 90 degrees.

6. The clock generation circuit according to any of claims 1 to 3, wherein the phase shifter corrects the phase so that a shift in phase between the rectangular-wave signal from the rectangular-wave generator and the output signal from the adding circuit becomes zero.

7. An analog-digital angle converter that uses two-phase resolver signals S1 and S2 corresponding to a rotation angle to output a digital angle of the rotation angle, the two-phase resolver signals being output from a rotation angle detector when an excitation signal is supplied, the analog-digital angle converter comprising:
a clock generation circuit for generating a synchronous clock from the resolver signals S1 and S2; and
a calculation processing section adapted to output the digital angle by using the resolver signals S1 and S2 and the synchronous clock from the clock generation circuit;
the clock generation circuit comprising:
a first squaring circuit for squaring the resolver signal S1;
a second squaring circuit for squaring the resolver signal S2;
an adding circuit for adding output signals from the first and second squaring circuits;
a rectangular-wave generator for generating a rectangular-wave signal from an output signal from the adding circuit;
a phase shifter for correcting a phase of the rectangular-wave signal from the rectangular-wave generator; and
a frequency dividing circuit for dividing by 2 an output signal from the phase shifter in frequency in synchronization with the excitation signal.

8. An angle detection apparatus comprising:

a rotation angle detector comprising windings for detection and windings for excitation and adapted to output two-phase resolver signals S1 and S2 corresponding to a rotation angle through the windings for detection when an excitation signal is supplied to the windings for excitation; and an analog-digital angle converter adapted to output a digital angle of the rotation angle by using the resolver signals S1 and S2;

the analog-digital angle converter comprising:

a clock generation circuit for generating a synchronous clock from the resolver signals S1 and S2; and a calculation processing section adapted to output the digital angle by using the resolver signals S1 and S2 and the synchronous clock generated by the clock generation circuit;

the clock generation circuit comprising:

a first squaring circuit for squaring the resolver signal S1;

a second squaring circuit for squaring the resolver signal S2;

an adding circuit for adding output signals from the first and second squaring circuits;

a rectangular-wave generator for generating a rectangular-wave signal from an output signal from the adding circuit;

a phase shifter for correcting a phase of the rectangular-wave signal from the rectangular-wave generator; and a frequency dividing circuit for dividing by 2 an output signal from the phase shifter in frequency in synchronization with the excitation signal.

* * * * *